United States Patent

Mariner et al.

Patent Number: 5,493,630
Date of Patent: Feb. 20, 1996

[54] PYROLYTIC BORON NITRIDE COATED FLASH EVAPORATOR

[75] Inventors: John T. Mariner, Avon Lake; Timothy J. Hejl, Parma, both of Ohio

[73] Assignee: Advanced Ceramics Corporation, Cleveland, Ohio

[21] Appl. No.: 314,313

[22] Filed: Sep. 28, 1994

[51] Int. Cl.⁶ .................................................. C23C 14/26
[52] U.S. Cl. ........................... 392/389; 118/726; 432/264
[58] Field of Search ................................... 392/388, 389, 392/391; 432/4, 44, 156, 263, 264, 265; 219/425, 427, 426; 427/255.7; 118/726

[56] References Cited

U.S. PATENT DOCUMENTS

| | | | |
|---|---|---|---|
| 3,537,886 | 11/1970 | Rively et al. | 219/427 |
| 3,539,769 | 11/1970 | Barker | 219/427 |
| 4,058,579 | 11/1977 | Lashway | 427/255.7 |
| 4,112,290 | 9/1978 | Nakajima et al. | 392/389 |
| 4,264,803 | 4/1981 | Shinko | 219/275 |
| 5,182,149 | 1/1993 | Finicle | 432/265 |
| 5,239,612 | 8/1993 | Morris | 392/389 |

OTHER PUBLICATIONS

IBM Techical Disclosure Bulletin vol. 27 No. 1A Jun. 1984 Cosgrove, J. F. "Titanium Evaporation Source".

*Primary Examiner*—Terry J. Owens
*Attorney, Agent, or Firm*—Eugene Lieberstein; Michael N. Meller

[57] ABSTRACT

A resistance heated evaporator includes a body of graphite having a generally rectangular geometry with opposite ends each of which has four sides. A coating of pyrolytic boron nitride covers substantially the entire surface of three of the sides at each end so as to form a channel which provides structural support at each end. At least one side at each end remains open for electrical contact to a power supply.

4 Claims, 2 Drawing Sheets

5,493,630

PYROLYTIC BORON NITRIDE COATED FLASH EVAPORATOR

FIELD OF INVENTION

This invention relates to a resistance heated flash evaporator for the vaporization of metals and more particularly to a flash evaporator coated with pyrolytic boron nitride (PBN).

BACKGROUND OF THE INVENTION

Vacuum deposition is a common method for coating metals such as aluminum, copper, zinc, and tin onto various substrates of metal, glass and plastic. The metal is vaporized in a vessel commonly referred to as a "vaporization boat" by electric resistance heating. The boat is connected to a source of electrical power to heat the vessel to a temperature which will cause the metal charge in contact with the boat to vaporize. Typically, the product is placed in an evacuated chamber within which the metal is vaporized. The product may be fed individually or continuously into the chamber or, alternatively, may form part of the chamber itself. A wide variety of product is coated with metal using vapor deposition including ,e.g., television picture tubes, automobile headlights, toys and the like.

Resistance heated vaporization boats in use today are commonly made of intermetallic composite materials such as titanium diboride and boron nitride or titanium diboride, boron nitride and aluminum nitride. An alternative composition for a vaporization boat employs a coating of pyrolytic boron nitride which may be coated over the composite material or more particularly over a substrate material of graphite as taught in U.S. Pat. No. 4,264,803 the disclosure of which is herein incorporated by reference. In general the substrate is first fabricated into a rectangular shape which is then coated with the pyrolytic boron nitride. The opposite ends of the substrate are left exposed to permit the boat to be electrically connected in circuit with a power supply via a contact assembly or clamp. A boat fabricated from graphite has been found to be particularly susceptible to breakage at the uncoated ends which tend to break off during handling. The fragile nature of the boat makes it difficult to handle without exercising special precaution to avoid breakage.

SUMMARY OF THE INVENTION

It has been discovered in accordance with the present invention that the susceptibility of the boat to breakage can be substantially eliminated by extending the pyrolytic coating over the ends of the boat on at least a portion of three of the exposed sides thereof in the form of a channel so as to partially enclose the ends of the boat thereby leaving open at least one side for electrical contact to a power supply.

The resistant heated flash evaporator of the present invention comprises: a body having a generally rectangular geometry with opposite ends each of which has four sides and a coating of pyrolytic boron nitride extending over at least a portion of three of said sides to form a channel leaving at least one side at each end open for electrical contact to a power supply.

BRIEF DESCRIPTION OF THE DRAWINGS

Other advantages of the present invention will become apparent from the following detailed description of the invention when read in conjunction with the accompanying drawings of which.

DETAILED DESCRIPTION OF THE INVENTION

Figure 1:
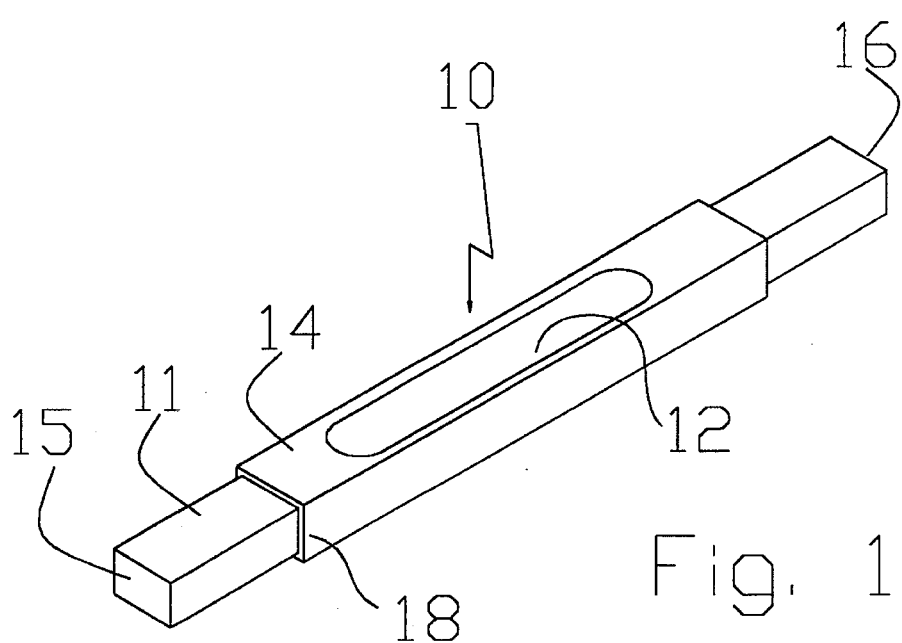
FIG. 1 is an isometric view of a typical vaporization boat having a pyrolytic boron nitride outer coating and uncoated opposite ends.
Figure 2:
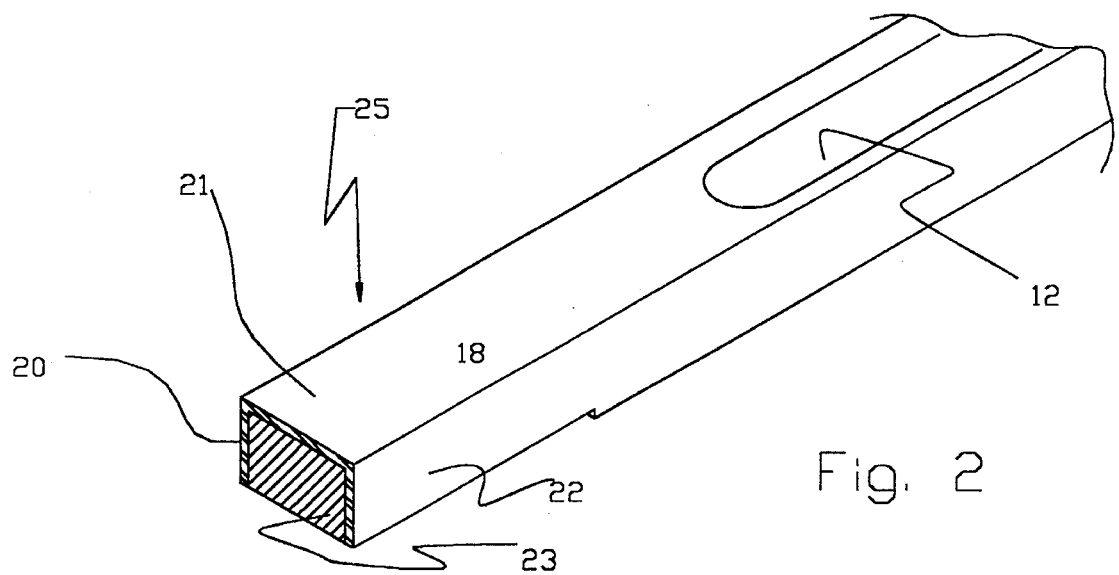
FIG. 2 is a fragmentary perspective view of the vaporization boat of the present invention.
Figure 3:
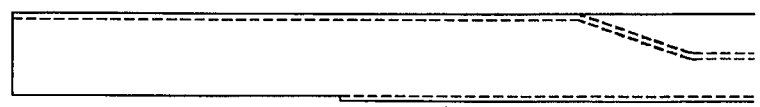
FIG. 3 is a side view of the fragmentary perspective of the vaporization boat shown in FIG. 2.

A vaporization boat 10 of the resistance type require a precise shape to match the resistance circuit. It is usually made long and narrow as is shown in FIG. 1 and contains a cavity or depression 12 machined into the body 11 on at least one surface 14. The body 11 is formed from a block of material of desired composition such as graphite. A thin layer of pyrolytic boron nitride 18 is coated over the body 11 of the boat 10. The process for forming a pyrolytic coating of boron nitride is conventional and briefly involves introducing vapors of ammonia and a gaseous boron halide in a suitable ratio into a heated furnace reactor containing the graphite body 11 with the furnace maintained at a controlled temperature of between 1800° C. to 2200° C. In the prior art configuration of FIG. 1 the coating 18 of pyrolytic boron nitride is usually no thicker than 0.030 inches and fully encapsulates the graphite body 11 except for the ends 15 and 16 which are exposed for making an electrical connection from the graphite body 11 to an external source of power (not shown) usually through a clamp assembly (not shown). The pyrolytic coating 18 may be removed from the ends 15 and 16 of the boat 10 by a machining operation or the ends 15 and 16 may be masked during the coating operation to prevent coating of the ends 15 and 16

The open ends 15 and 16 of the boat each have fours sides 20, 21, 22 and 23 respectively. In accordance with the present invention it has been discovered that the susceptibility of the boat to breakage can be substantially eliminated by extending the pyrolytic coating 18 over at least a portion of three of the exposed sides to form a three sided channel 25 which partially encloses the ends 15 and 16 of the boat 10 but leaves open one of the sides e.g. side 23 on the bottom thereof to permit electrical contact to be made to an external power supply in the conventional manner. This has been found to completely eliminate the problem of breakage. The channel 25 should have the configuration of the body of the boat each opposite end except where the channel is open. The channel 25 has been shown to form a structural shell which increases the strength of the boat 10 at its ends 15 and 16. It is not necessary for the channel 25 to completely cover three sides of each end 15 and 16 respectively i.e., the channel 25 need only cover one surface (e.g. the top surface 21) and partially extend down the side surfaces 20 and 22. The channel provides structural support essentially equivalent to a fully encapsulated coating of the same thickness.

The overall height of each end 15 and 16 can be machined to a controlled dimension by first exposing the graphite substrate 11 on the desired electrical contact surface (e.g. the bottom surface 23) at each end thereof. Thereafter, the face opposite the contact surface can be lightly machined to provide an overall coated height. This will compensate for variations in coating thickness while giving a standard dimension for clamping the ends 15 and 16 respectively. Obviously, any of the sides 20, 21, 22 and 23 could be left exposed for electrical contact.

What we claim is:

1. A resistant heated flash evaporator for flash evaporating metal in contact with the evaporator comprising: a body having opposite ends each of which has four sides and a coating of pyrolytic boron nitride substantially covering the entire surface of three of said sides to form a three sided channel at each opposite end leaving at least one side at each opposite end open for electrical contact to a power supply whereby said channel forms a structural support at each opposite end.

2. A resistant heated flash evaporator as defined in claim 1 wherein the body of said evaporator is composed of graphite.

3. A resistant heated flash evaporator as defined in claim 2 wherein said body has a substantially rectangular geometry and said channel formed on three of its sides has a shape in substantial conformity with the shape of the body over the three sides at each opposite end of the evaporator.

4. A resistant heated flash evaporator as defined in claim 3 wherein sad pyrolytic coating fully covers three of said four sides at each end thereof.

* * * * *